United States Patent
Daems et al.

(10) Patent No.: US 9,309,341 B2
(45) Date of Patent: *Apr. 12, 2016

(54) CURABLE JETTABLE FLUID FOR MAKING A FLEXOGRAPHIC PRINTING MASTER

(75) Inventors: Eddie Daems, Herentals (BE); Luc Vanmaele, Lochristi (BE)

(73) Assignee: Agfa Graphics NV, Mortsel (BE)

( * ) Notice: Subject to any disclaimer, the term of this patent is extended or adjusted under 35 U.S.C. 154(b) by 19 days.

This patent is subject to a terminal disclaimer.

(21) Appl. No.: 13/995,315

(22) PCT Filed: Dec. 19, 2011

(86) PCT No.: PCT/EP2011/073195
§ 371 (c)(1),
(2), (4) Date: Jun. 18, 2013

(87) PCT Pub. No.: WO2012/084786
PCT Pub. Date: Jun. 28, 2012

(65) Prior Publication Data
US 2013/0276653 A1    Oct. 24, 2013

Related U.S. Application Data

(60) Provisional application No. 61/425,256, filed on Dec. 21, 2010.

(30) Foreign Application Priority Data

Dec. 20, 2010 (EP) .................................. 10195891

(51) Int. Cl.
*B41N 1/00*    (2006.01)
*C08F 220/36*    (2006.01)
(Continued)

(52) U.S. Cl.
CPC ............... *C08F 220/36* (2013.01); *B41C 1/003* (2013.01); *G03F 7/027* (2013.01); *G03F 7/031* (2013.01); *G03F 7/035* (2013.01)

(58) Field of Classification Search
CPC ...... B41C 1/003; G03F 7/2012; C09D 11/30; C09D 11/101
USPC ........................................ 101/401.1; 430/306
See application file for complete search history.

(56) References Cited

U.S. PATENT DOCUMENTS

| | | |
|---|---|---|
| 4,963,471 A | 10/1990 | Trout et al. |
| 5,301,610 A | 4/1994 | McConnell |

(Continued)

FOREIGN PATENT DOCUMENTS

| | | |
|---|---|---|
| EP | 0 641 648 A1 | 3/1995 |
| EP | 1 142 966 A1 | 10/2001 |

(Continued)

OTHER PUBLICATIONS

Chern, Principles and applications of emulsion polymerization (2008) p. 228.

*Primary Examiner* — Chanceity Robinson
(74) *Attorney, Agent, or Firm* — Leydig, Voit & Mayer, Ltd.

(57) ABSTRACT

The present invention relates to a curable jettable fluid for making a flexographic printing master characterized in that the jettable fluid has a viscosity measured at jetting temperature of less than 15 mPa·s and comprises at least 50 wt. % of a mixture of a cyclic monofunctional (meth)acrylate monomer, a monofunctional urethane acrylate oligomer and a difunctional (meth)acrylate monomer.

25 Claims, 1 Drawing Sheet

(51) Int. Cl.
  *B41C 1/00*   (2006.01)
  *G03F 7/027*  (2006.01)
  *G03F 7/031*  (2006.01)
  *G03F 7/035*  (2006.01)

(56) References Cited

U.S. PATENT DOCUMENTS

| | | |
|---|---|---|
| 6,130,980 A | 10/2000 | Murphy et al. |
| 6,235,916 B1 | 5/2001 | Thames et al. |
| 6,520,084 B1 | 2/2003 | Gelbart |
| 6,806,018 B2 | 10/2004 | Kanga et al. |
| 7,036,430 B2 | 5/2006 | Figov et al. |
| 2002/0046668 A1 | 4/2002 | Bell et al. |
| 2004/0029044 A1 | 2/2004 | Severance et al. |
| 2004/0141040 A1 | 7/2004 | Nakajima |
| 2005/0261388 A1 | 11/2005 | Gould et al. |
| 2006/0055761 A1 | 3/2006 | Daems et al. |
| 2008/0053326 A1 | 3/2008 | Murphy et al. |
| 2009/0004579 A1 | 1/2009 | Sarmah et al. |
| 2009/0197013 A1 | 8/2009 | Gouch et al. |
| 2010/0076107 A1 | 3/2010 | Kitano et al. |
| 2013/0269558 A1 | 10/2013 | Vanmaele et al. |
| 2013/0319273 A1 | 12/2013 | Vanmaele et al. |
| 2014/0109784 A1 | 4/2014 | Daems et al. |

FOREIGN PATENT DOCUMENTS

| | | | |
|---|---|---|---|
| EP | 1 170 121 A1 | | 1/2002 |
| EP | 1 428 666 A1 | | 6/2004 |
| EP | 1 449 648 A2 | | 8/2004 |
| EP | 1 503 242 A2 | | 2/2005 |
| EP | 1616897 A1 | | 1/2006 |
| EP | 1616899 A1 | | 1/2006 |
| EP | 1616920 A1 | | 1/2006 |
| EP | 1 637 322 A2 | | 3/2006 |
| EP | 1 637 926 A2 | | 3/2006 |
| EP | 1 710 093 A1 | | 10/2006 |
| EP | 1 936 438 A1 | | 6/2008 |
| EP | 1 968 057 A2 | | 9/2008 |
| EP | 1 970 417 A1 | | 9/2008 |
| EP | 2 033 778 A1 | | 3/2009 |
| EP | 2 033 949 A1 | | 3/2009 |
| EP | 2033778 A1 | * | 3/2009 |
| EP | 2065362 A1 | | 6/2009 |
| EP | 2130817 A1 | | 12/2009 |
| EP | 2130818 A1 | * | 12/2009 |
| EP | 2161264 A1 | | 3/2010 |
| EP | 2161290 A1 | | 3/2010 |
| EP | 2 199 065 A1 | | 6/2010 |
| EP | 2 199 081 A1 | | 6/2010 |
| EP | 2 199 082 A1 | | 6/2010 |
| EP | 2 199 273 A1 | | 6/2010 |
| EP | 2199082 A1 | * | 6/2010 |
| EP | 2 223 803 A1 | | 9/2010 |
| EP | 2 251 913 A2 | | 11/2010 |
| EP | 2 371 541 A1 | | 10/2011 |
| EP | 2371541 A1 | | 10/2011 |
| EP | 2 420 382 A1 | | 2/2012 |
| EP | 2420382 A1 | | 2/2012 |
| EP | 2420383 A1 | | 2/2012 |
| JP | 2009191179 A | | 8/2009 |
| WO | WO 97/16469 | | 5/1997 |
| WO | WO 9716469 A1 | * | 5/1997 |
| WO | WO 2004/028225 A1 | | 4/2004 |
| WO | WO 2005/089957 A1 | | 9/2005 |
| WO | WO 2008/074759 A1 | | 6/2008 |
| WO | WO 2008/077850 A2 | | 7/2008 |
| WO | WO 2011/144596 A1 | | 11/2011 |
| WO | WO 2012/084706 A1 | | 6/2012 |
| WO | WO 2012/084786 A1 | | 6/2012 |
| WO | WO 2012/084811 A1 | | 6/2012 |

\* cited by examiner

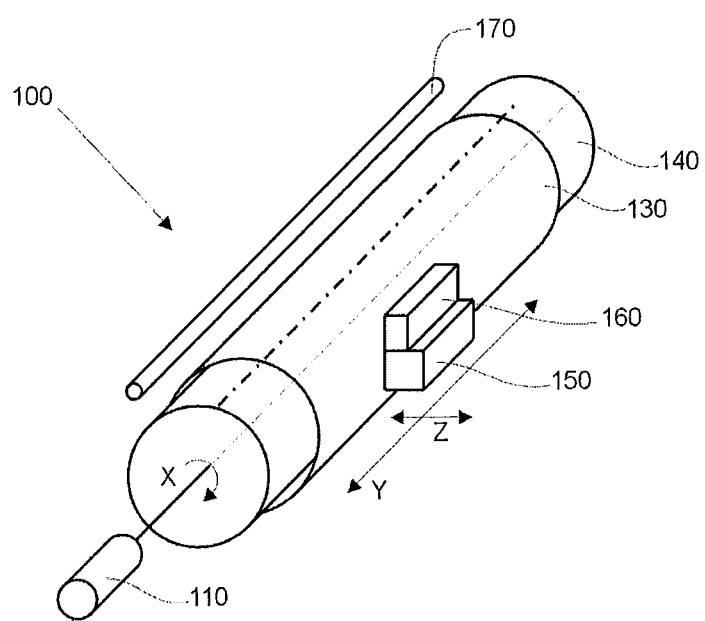

CURABLE JETTABLE FLUID FOR MAKING A FLEXOGRAPHIC PRINTING MASTER

CROSS-REFERENCE TO RELATED APPLICATIONS

This application is the U.S. national phase of PCT/EP2011/073195, filed Dec. 19, 2011, claiming the benefit of European Patent Application No. 10195891.6, filed Dec. 20, 2010, and U.S. Provisional Patent Application No. 61/425,256, filed Dec. 21, 2010; the disclosures of the '195, '891, and '256 applications are incorporated by reference.

FIELD OF THE INVENTION

The present invention relates to a curable jettable fluid for making a flexographic printing master and to a method for making a flexographic printing master by inkjet.

BACKGROUND OF THE INVENTION

Flexography is today one of the most important printing techniques. It is used for printing on a variety of substrates such as paper, paperboard stock, corrugated board, films, foils and laminates. Coarse surfaces and stretch films can only be printed economically with flexography, making it indeed very appropriate for packaging material printing.

Today flexographic printing masters are prepared by both analogue and digital imaging techniques. Analogue imaging typically uses a film mask through which a flexographic printing precursor is exposed. Digital imaging techniques include:

Direct laser engraving as disclosed in e.g. EP-As 1710093 and 1936438;

UV exposure through a LAMS mask wherein LAMS stands for Laser Ablative Mask System as disclosed in e.g. EP-A 1170121;

Direct UV or violet exposure by laser or LED as disclosed in e.g. U.S. Pat. No. 6,806,018; and Inkjet printing as disclosed in e.g. EP-As 1428666 and 1637322.

The major advantage of an inkjet method for preparing a flexographic printing master is an improved sustainability due to the absence of any processing steps and the consumption of no more material as necessary to form a suitable relief image (i.e. removal of material in the non printing areas is no longer required).

EP-A 641648 discloses a method of making a photopolymer relief-type printing plate wherein a positive or negative image is formed on a substrate by inkjet printing with a photopolymeric ink, optionally preheated to a temperature between 30 and 260° C. and subjecting the resulting printed substrate to UV radiation, thereby curing the ink composition forming the image.

U.S. Pat. No. 6,520,084 discloses a method of preparing flexographic printing masters by inkjet wherein a removable filler material is used to support the relief image being printed and wherein the relief image is grown in inverted orientation on a substrate. Disadvantages of this method are the removal of the filler material and the release of the relief image from the substrate.

EP-A 1428666 discloses a method of making a flexographic printing master by means of jetting subsequent layers of a curable fluid on a flexographic support. Before jetting the following layer, the previous layer is immobilized by a curing step.

In U.S. Pat. No. 7,036,430 a flexographic printing master is prepared by inkjet wherein each layer of ink is first jetted and partially cured on a blanket whereupon each such layer is then transferred to a substrate having an elastomeric floor, thereby building up the relief image layer by layer. A similar method is disclosed in EP-A 1449648 wherein a lithographic printing plate is used to transfer such layers of ink to a substrate.

US20080053326 discloses a method of making a flexographic printing master by inkjet wherein successive layers of a polymer are applied to a specific optimized substrate. In US20090197013, also disclosing an inkjet method of making a flexographic printing master, curing means are provided to additionally cure, for example, the side surfaces of the image relief being formed. In EP-A 2223803 a UV curable hot melt ink is used. Each of the deposited layers of ink is gelled before the deposition of a subsequent layer on the deposited layer. After the printing master with sufficient thickness is formed, the ink is cured.

EP-As 1637926 and 1637322 disclose a specific curable jettable fluid for making flexographic printing masters comprising a photo-initiator, a monofunctional monomer, a polyfunctional monomer or oligomer and at least 5 wt. of a plasticizer. The presence of the plasticizer is necessary to obtain a flexographic printing master having the necessary flexibility. Also in EP-A 2033778, the curable jettable fluid for making a relief image by inkjet on a sleeve body contains a plasticizer.

A flexographic printing master formed on a support by an inkjet method typically comprises an elastomeric floor, an optional mesa relief and an image relief as disclosed in EP-A 2199082.

To realize a high resolution with such an inkjet method, particularly for printing the image relief which determines the finally printed image, it is advantageous to use a printhead with small nozzle diameters, for example producing 3 pl fluid droplets. However, such a small nozzle diameter requires low viscosity inks.

A jettable fluid comprising a plasticizer as prescribed in EP-As 1637926, 1637322, 2199082 and 2199081 has two disadvantages. Firstly, the plasticizers may migrate towards the surface of the image relief as a function of time or may be extracted out of the relief image by the printing ink during the flexographic printing process. This may result in a change of the physical properties of the image relief and as a result thereof of the printing properties of the image relief. Secondly, the presence of plasticizers in the ink often results in a too high viscosity.

SUMMARY OF THE INVENTION

It is an object of the present invention to provide a curable jettable fluid for making a flexographic printing master by inkjet wherein the printing master has excellent "flexographic" properties and enables high resolution printing.

The object of the present invention is realised with a curable jettable fluid for making a flexographic printing master by inkjet characterized in that the jettable fluid has a viscosity measured at jetting temperature of less than 15 mPa·s and comprises at least 50 wt. % of a mixture of a cyclic monofunctional (meth)acrylate monomer, a monofunctional urethane acrylate oligomer and a difunctional (meth)acrylate monomer.

BRIEF DESCRIPTION OF THE DRAWINGS

FIG. 1 shows an embodiment of an apparatus for printing a flexographic printing master on a cylindrical sleeve.

DETAILED DESCRIPTION OF THE INVENTION

The curable jettable fluid according to the present invention for making a flexographic printing master characterized in that the jettable fluid has a viscosity measured at jetting temperature of less than 15 mPa·s and comprises at least 50 wt. % of a mixture of a cyclic monofunctional (meth)acrylate monomer, a monofunctional urethane acrylate oligomer and a difunctional (meth)acrylate monomer.

The curable jettable fluid may further comprise an initiator, polymerization inhibitors, compounds which decrease oxygen inhibition during polymerization, elastomers, surfactants, colorants, solvents, humectants and/or biocides.

Cyclic Monofunctional (Meth)Acrylate Monomer

The curable jettable fluid comprises a cyclic monofunctional (meth)acrylate monomer. Examples of such cyclic monofunctional acrylates are isobornyl acrylate (SR506D from Sartomer), tetrahydrofurfuryl methacrylate (SR203 from Sartomer), 4-t.butylcyclohexyl arylate (Laromer TBCH from BASF), dicyclopentadienyl acrylate (Laromer DCPA from BASF), dioxalane functional acrylates (CHDOL10 and MEDOL10 from San Esters Corporation), cyclic trimethylolpropane formal acrylate (SR531 from Sartomer), 2-phenoxyethyl acrylate (SR339C from Sartomer), 2-phenoxyethyl methacrylate (SR340 from Sartomer), tetrahydrofurfuryl acrylate (SR285 from Sartomer), 3,3,5-trimethyl cyclohexyl acrylate (CD420 from Sartomer).

Particularly preferred cyclic monofunctional acrylates monomers are isobornyl acrylate (IBOA) and 4-t.butylcyclohexyl arylate (Laromer TBCH from BASF).

The amount of the cyclic monofunctional (meth)acrylate monomer is preferably at least 40 wt. % of the total monomer content.

Monofunctional Urethane Acrylate Oligomer

Urethane acrylates oligomers are well known and are prepared by reacting polyisocyanates with hydroxyl alkyl acrylates, usually in the presence of a polyol compound. Their functionality (i.e. number of acrylate groups) varies from 1 to 6. A lower functionality results in lower reactivity, better flexibility and a lower viscosity. Therefore, monofunctional urethane acrylate oligomers are used in the present invention.

The polyol compound forms the backbone of the urethane acrylate. Typically the polyol compounds are polyether or polyester compounds with a functionality (hydroxyl groups) ranging from two to four. Polyether urethane acrylates are generally more flexible, provide lower cost, and have a slightly lower viscosity and are therefore preferred.

The most preferred monofunctional urethane acrylate oligomers are monofunctional aliphatic urethane acrylates having a very low viscosity of 100 mPa·s or lower at 25° C., like for example Genomer 1122 (2-acrylic acid 2-{[(butylamino)carbonyl]oxy}ethyl ester, available from Rahn AG) and Ebecryl 1039 (available from Cytec Industries Inc.).

The total amount of the monofunctional urethane acrylate oligomer is preferably at least 10 wt. % of the total monomer content.

Difunctional (Meth)Acrylate Monomer

A preferred difunctional (meth)acrylate monomer is a polyalkylene glycol di(meth)acrylate. Such compounds have two acrylate or methacrylate groups attached by an ester linkage at the opposite ends of a hydrophilic polyalkylene glycol.

Typically, the longer the length of the polyalkylene chain, the softer and more flexible the obtained layer after curing.

Examples of such polyalkylene glycol di(meth)acrylates include: 1,3-butylene glycol diacrylate, 1,3-butylene glycol dimethacrylate, diethylene glycol diacrylate, diethylene glycol dimethacrylate, dipropylene glycol diacrylate, ethylene glycol dimethacrylate, polyethylene glycol (200) diacrylate, polyethylene glycol (400) diacrylate, polyethylene glycol (400) dimethacrylate, polyethylene glycol (600) diacrylate, polyethylene glycol (600) dimethacrylate, polyethylene glycol dimethacrylate, polypropylene glycol (400) dimethacrylate, tetraethylene glycol diacrylate, tetraethylene glycol dimethacrylate, triethylene glycol diacrylate, triethylene glycol dimethacrylate, tripropylene glycol diacrylate, tripropylene glycol diacrylate, and combinations thereof. The number between brackets in the above list refers to the Molecular Weight (MW) of the polyalkylene chain.

Highly preferred polyalkylene glycol diacrylates are polyethylene glycol diacrylates. Specific examples of commercially available polyethylene glycol diacrylate monomers include SR259 [polyethylene glycol (200) diacrylate], SR344 [polyethylene glycol (400) diacrylate], SR603 [polyethylene glycol (400) dimethacrylate], SR610 [polyethylene glycol (600) diacrylate], SR252 [polyethylene glycol (600) dimethacrylate], all Sartomer products; EBECRYL 11 [poly ethylene glycol diacrylate from Cytec; Genomer 1251 [polyethylene glycol 400 diacrylate] from Rahn.

Polyethylene glycol (600) diacrylate, available as SR610 from Sartomer, is particularly preferred.

Other preferred difunctional acrylate or methacrylate monomers are e.g. butane diol diacrylate, alkoxylated hexanediol diacrylate, alkoxylated neopentyl glycol diacrylate and alkoxylated hexanediol dimethacrylate.

The amount of the difunctional (meth)acrylate is preferably at least 10 wt. % of the total monomer content.

Other Monomers or Oligomers

Additional mono- or multifunctional monomers or oligomers may be used to further optimize the properties of the curable jettable fluid.

Initiators

The curable jettable fluid comprises an initiator which, upon exposure to radiation or heat, initiates the curing, i.e. polymerization, of the jetted droplets.

However, it is also possible to carry out the curing by electron beam radiation where the presence of an initiator is not mandatory.

Preferably a photo-initiator is used which upon absorption of actinic radiation, preferably UV-radiation, forms high-energy species (for example radicals) inducing polymerization and crosslinking of the monomers and oligomers of the jetted droplets.

A combination of two or more photo-initiators may be used. A photo-initiator system, comprising a photo-initiator and a co-initiator, may also be used. A suitable photo-initiator system comprises a photo-initiator, which upon absorption of actinic radiation forms free radicals by hydrogen abstraction or electron extraction from a second compound, the co-initiator. The co-initiator becomes the actual initiating free radical.

Irradiation with actinic radiation may be realized in two steps, each step using actinic radiation having a different wavelength and/or intensity. In such cases it is preferred to use 2 types of photo-initiators, chosen in function of the different actinic radiation used.

Suitable photo-initiators are disclosed in EP-A 1637926 paragraph [0077] to [0079].

A preferred total amount of initiator is 1 to 10 wt. %, more preferably 2.5 to 7.5 wt. %, of the total curable jettable liquid weight.

Inhibitors

Suitable polymerization inhibitors include phenol type antioxidants, hindered amine light stabilizers, phosphor type antioxidants, hydroquinone monomethyl ether commonly used in (meth)acrylate monomers, and hydroquinone, methylhydroquinone, t-butylcatechol, pyrogallol may also be used. Of these, a phenol compound having a double bond in molecules derived from acrylic acid is particularly preferred due to its having a polymerization-restraining effect even when heated in a closed, oxygen-free environment. Suitable inhibitors are, for example, Sumilizer® GA-80, Sumilizer® GM and Sumilizer® GS produced by Sumitomo Chemical Co., Ltd.

Since excessive addition of these polymerization inhibitors will lower the sensitivity to curing of the curable jettable liquid, it is preferred that the amount capable of preventing polymerization be determined prior to blending. The amount of a polymerization inhibitor is generally between 200 and 20 000 ppm of the total curable jettable liquid weight.

Oxygen Inhibition

Suitable combinations of compounds which decrease oxygen polymerization inhibition with radical polymerization inhibitors are: 2-benzyl-2-dimethylamino-1-(4-morpholinophenyl)-butane-1 and 1-hydroxy-cyclohexyl-phenyl-ketone; 1-hydroxy-cyclohexyl-phenyl-ketone and benzophenone; 2-methyl-1[4-(methylthio)phenyl]-2-morpholino-propane-1-on and diethylthioxanthone or isopropylthioxanthone; and benzophenone and acrylate derivatives having a tertiary amino group, and addition of tertiary amines. An amine compound is commonly employed to decrease an oxygen polymerization inhibition or to increase sensitivity. However, when an amine compound is used in combination with a high acid value compound, the storage stability at high temperature tends to be decreased. Therefore, specifically, the use of an amine compound with a high acid value compound in inkjet printing should be avoided.

Synergist additives may be used to improve the curing quality and to diminish the influence of the oxygen inhibition. Such additives include, but are not limited to ACTILANE® 800 and ACTILANE® 725 available from AKZO NOBEL, Ebecryl® P115 and Ebecryl® 350 available from UCB CHEMICALS and CD 1012, Craynor CN 386 (amine modified acrylate) and Craynor CN 501 (amine modified ethoxylated trimethylolpropane triacrylate) available from CRAY VALLEY.

The content of the synergist additive is in the range of 0 to 20 wt. %, preferably in the range of 5 to 15 wt. %, based on the total weight of the curable jettable liquid.

Elastomeric Binder

The elastomeric binder may be a single binder or a mixture of various binders. The elastomeric binder is an elastomeric copolymer of a conjugated diene-type monomer and a polyene monomer having at least two non-conjugated double bonds, or an elastomeric copolymer of a conjugated diene-type monomer, a polyene monomer having at least two non-conjugated double bonds and a vinyl monomer copolymerizable with these monomers.

Preferred elastomeric binders are disclosed in EP-A 1637926 paragraph [0092] and [0093].

However, due to their high molecular weight, the addition of elastomeric binders may cause an increase in viscosity of the jettable fluid. Therefore, the amount of elastomeric binder is preferably less than 5 wt. %. In a particular preferred embodiment, no elastomeric binder is added.

Surfactants

The surfactant(s) may be anionic, cationic, non-ionic, or zwitter-ionic and are usually added in a total amount below 20 wt. %, more preferably in a total amount below 10 wt. %, each based on the total curable jettable liquid weight.

Fluorinated or silicone compounds are preferably used as a surfactant, however, a potential drawback is bleed-out after image formation because the surfactant does not cross-link. It is therefore preferred to use a copolymerizable monomer having surface-active effects, for example, silicone-modified acrylates, silicone modified methacrylates, fluorinated acrylates, and fluorinated methacrylates.

Colorants

Colorants may be dyes or pigments or a combination thereof. Organic and/or inorganic pigments may be used.

Suitable dyes include direct dyes, acidic dyes, basic dyes and reactive dyes.

Suitable pigments are disclosed in EP-A 1637926 paragraphs [0098] to [0100].

The pigment is present in the range of 0.01 to 10 wt. %, preferably in the range of 0.1 to 5 wt. %, each based on the total weight of curable jettable liquid.

Solvents

The curable jettable liquid preferably does not contain an evaporable component, but sometimes, it can be advantageous to incorporate an extremely small amount of a solvent to improve adhesion to the ink-receiver surface after UV curing. In this case, the added solvent may be any amount in the range of 0.1 to 10.0 wt. %, preferably in the range of 0.1 to 5.0 wt. %, each based on the total weight of curable jettable liquid.

Humectants

When a solvent is used in the curable jettable liquid, a humectant may be added to prevent the clogging of the nozzle, due to its ability to slow down the evaporation rate of curable jettable liquid.

Suitable humectants are disclosed in EP-A 1637926 paragraph [0105]. A humectant is preferably added to the curable jettable liquid formulation in an amount of 0.01 to 20 wt. % of the formulation, more preferably in an amount of 0.1 to 10 wt. % of the formulation.

Biocides

Suitable biocides include sodium dehydroacetate, 2-phenoxyethanol, sodium benzoate, sodium pyridinethion-1-oxide, ethyl p-hydroxy-benzoate and 1,2-benzisothiazolin-3-one and salts thereof. A preferred biocide is Proxel® GXL available from ZENECA COLOURS. A biocide is preferably added in an amount of 0.001 to 3 wt. %, more preferably in an amount of 0.01 to 1.00 wt. %, each based on the total weight of the curable jettable liquid.

Preparation of a Curable Jettable Fluid

The curable jettable liquids may be prepared as known in the art by mixing or dispersing the ingredients together, optionally followed by milling, as described for example in EP-A 1637322 paragraph [0108] and [0109].

Viscosity of the Curable Jettable Fluid

In order that the curable jettable fluid can be used with printheads having small nozzle diameters, for example producing 3 pl fluid droplets, the viscosity of the curable jettable fluid at jetting temperature is less than 15 mPa·s, preferably less than 12 mPa·s, more preferably less than 10 mPa·s.

Method of Preparing a Flexographic Printing Master

The second embodiment of the present invention is a method of preparing a flexographic printing master comprising the steps of:
  providing a flexographic support;
  jetting subsequent layers of a curable fluid as defined above on said support; and
  at least partially curing each jetted layer before the following layer is applied.

Preferred methods of preparing the flexographic printing master are disclosed in EP-As 1637322, 2199081, 2199082 and WO2008/077850 and in the unpublished EP-A 10163064.8 (filed 2010 May 18).

Flexographic Printing Support

Two forms of flexographic printing supports may be used: a plate form and a cylindrical form, the latter commonly referred to as a sleeve. If the print master is created as a plate form on a flatbed inkjet device, the mounting of the plate form on a printing cylinder may introduce mechanical distortions resulting in so-called anamorphic distortion in the printed image. Such a distortion may be compensated by an anamorphic pre-compensation in an image processing step prior to halftoning. Creating the print master directly on a sheet form mounted on a print cylinder or directly on a sleeve avoids the problem of geometric distortion altogether.

Using a sleeve as support provides improved registration accuracy and faster change over time on press. Furthermore, sleeves may be well-suited for mounting on an inkjet printer having a rotating drum, as shown in FIG. 1. This also makes it possible to create seamless flexographic printing sleeves, which have applications in printing continuous designs such as in wallpaper, decoration, gift wrapping paper and packaging.

The term "flexographic printing support", often encompasses two types of support:
- a support without elastomeric layers on its surface; and
- a support with one or more elastomeric layers on its surface. The one or more elastomeric layers form the so-called elastomeric floor.

In the method of the present invention, the flexographic printing support referred to is a support, preferably a sleeve, without one or more elastomeric layers forming an elastomeric floor. Such a sleeve is also referred to as a basic sleeve or a sleeve base. Basic sleeves typically consist of composites, such as epoxy or polyester resins reinforced with glass fibre or carbon fibre mesh. Metals, such as steel, aluminium, copper and nickel, and hard polyurethane surfaces (e.g. durometer 75 Shore D) can also be used. The basic sleeve may be formed from a single layer or multiple layers of flexible material, as for example disclosed by US2002466668. Flexible basic sleeves made of polymeric films can be transparent to ultraviolet radiation and thereby accommodate backflash exposure for building a floor in the cylindrical printing element. Multiple layered basic sleeves may include an adhesive layer or tape between the layers of flexible material. Preferred is a multiple layered basic sleeve as disclosed in U.S. Pat. No. 5,301,610. The basic sleeve may also be made of non-transparent, actinic radiation blocking materials, such as nickel or glass epoxy. The basic sleeve typically has a thickness from 0.1 to 1.5 mm for thin sleeves and from 2 mm to as high as 100 mm for other sleeves. For thick sleeves often combinations of a hard polyurethane surface with a low-density polyurethane foam as an intermediate layer combined with a fibreglass reinforced composite core are used as well as sleeves with a highly compressible surface present on a sleeve base. Depending upon the specific application, sleeve bases may be conical or cylindrical. Cylindrical sleeve bases are used primarily in flexographic printing.

The basic sleeve or flexographic printing sleeve is stabilized by fitting it over a steel roll core known as an air mandrel or air cylinder. Air mandrels are hollow steel cores which can be pressurized with compressed air through a threaded inlet in the end plate wall. Small holes drilled in the cylindrical wall serve as air outlets. The introduction of air under high pressure permits to float the sleeve into position over an air cushion. Certain thin sleeves are also expanded slightly by the compressed air application, thereby facilitating the gliding movement of the sleeve over the roll core. Foamed adapter or bridge sleeves are used to "bridge" the difference in diameter between the air-cylinder and a flexographic printing sleeve containing the printing relief. The diameter of a sleeve depends upon the required repeat length of the printing job.

Apparatus for Creating the Flexographic Printing Master

Various embodiments of an apparatus for creating the flexographic printing master by inkjet printing may be used. In principle a flat bed printing device may be used, however, a drum based printing device is preferred. A particularly preferred drum (140) based printing device (100) using a sleeve body (130) as flexographic support is shown in FIG. 1. The rotating drum (140) is driven by a motor (110).

Printhead

The means for inkjet printing includes any device capable of coating a surface by breaking up a radiation curable fluid into small droplets which are then directed onto the surface. In the most preferred embodiment the radiation curable fluids are jetted by one or more printing heads ejecting small droplets in a controlled manner through nozzles onto a flexographic printing support, which is moving relative to the printing head(s). A preferred printing head for the inkjet printing system is a piezoelectric head. Piezoelectric inkjet printing is based on the movement of a piezoelectric ceramic transducer when a voltage is applied thereto. The application of a voltage changes the shape of the piezoelectric ceramic transducer in the printing head creating a void, which is then filled with radiation curable fluid. When the voltage is again removed, the ceramic returns to its original shape, ejecting a drop of fluid from the print head. However the inkjet printing method is not restricted to piezoelectric inkjet printing. Other inkjet printing heads can be used and include various types, such as a continuous type and thermal, electrostatic and acoustic drop on demand types. At high printing speeds, the radiation curable fluids must be ejected readily from the printing heads, which puts a number of constraints on the physical properties of the fluid, e.g. a low viscosity at the jetting temperature, which may vary from 25° C. to 110° C. and a surface energy such that the printing head nozzle can form the necessary small droplets.

An example of a printhead according to the current invention is capable to eject droplets having a volume between 0.1 and 100 picoliter (pl) and preferably between 1 and 30 pl. Even more preferably the droplet volume is in a range between 1 pl and 8 pl. Even more preferably the droplet volume is only 2 or 3 pl.

The unpublished EP-A's 10173533.0 and 10173538.9 (both filed 2010 Aug. 20) and 10158421.7 (filed 2010 Mar. 30) preferred constellations of multiple printheads, preferably back to back printheads, are disclosed.

Curing

Typically for each layer of the relief image, immediately after the deposition of a fluid droplet by the printhead the fluid droplet is exposed by a curing source. This provides immobilization and prevents the droplets to run out, which would deteriorate the quality of the print master. Such curing of applied fluid drops is often referred to as "pinning".

Curing can be "partial" or "full". The terms "partial curing" and "full curing" refer to the degree of curing, i.e. the percentage of converted functional groups, and may be determined by, for example, RT-FTIR (Real-Time Fourier Transform Infa-Red Spectroscopy) which is a method well known to the one skilled in the art of curable formulations. Partial curing is defined as a degree of curing wherein at least 5%, preferably 10%, of the functional groups in the coated formulation or the fluid droplet is converted. Full curing is defined as a degree of curing wherein the increase in the percentage of converted functional groups with increased exposure to radiation (time and/or dose) is negligible. Full curing corresponds with a conversion percentage that is within 10%, preferably 5%, from the maximum conversion percentage. The maximum conversion percentage is typically determined by the horizontal asymptote in a graph representing the percentage conversion versus curing energy or curing time. When in the present application the term "no curing" is used, this means that less than 5%, preferably less than 2.5%, most preferably less than 1%, of the functional groups in the coated formulation or the fluid droplet are converted. In the method according to the present invention, applied fluid droplets which are not cured are allowed to spread or coalesce with adjacent applied fluid droplets.

Curing may be performed by heating (thermal curing), by exposing to actinic radiation (e.g. UV curing) or by electron beam curing. Preferably the curing process is performed by UV radiation.

The curing means may be arranged in combination with the inkjet printhead, travelling therewith so that the curable fluid is exposed to curing radiation very shortly after been jetted (see FIG. 1, curing means 150, printhead 160). It may be difficult to provide a small enough radiation source connected to and travelling with the print head. Therefore, a static fixed radiation source may be employed, e.g. a source of UV-light, which is then connected to the printhead by means of flexible radiation conductive means such as a fibre optic bundle or an internally reflective flexible tube.

Alternatively, a source of radiation arranged not to move with the print head, may be an elongated radiation source extending transversely across the flexographic printing support surface to be cured and parallel with the slow scan direction of the print head (see FIG. 1, curing means 170). With such an arrangement, each applied fluid droplet is cured when it passes beneath the curing means 170. The time between jetting and curing depends on the distance between the printhead and the curing means 170 and the rotational speed of the rotating drum 140.

A combination of both curing means 150 and 170 can also be used as depicted in FIG. 1.

Any UV light source, as long as part of the emitted light can be absorbed by the photo-initiator or photo-initiator system of the fluid droplets, may be employed as a radiation source, such as, a high or low pressure mercury lamp, a cold cathode tube, a black light, an ultraviolet LED, an ultraviolet laser, and a flash light. For curing the inkjet printed radiation curable fluid, the imaging apparatus preferably has a plurality of UV light emitting diodes. The advantage of using UV LEDs is that it allows a more compact design of the imaging apparatus.

UV radiation is generally classified as UV-A, UV-B, and UV-C as follows:
UV-A: 400 nm to 320 nm
UV-B: 320 nm to 290 nm
UV-C: 290 nm to 100 nm The most important parameters when selecting a curing source are the spectrum and the intensity of the UV-light. Both parameters affect the speed of the curing. Short wavelength UV radiation, such as UV-C radiation, has poor penetration capabilities and enables to cure droplets primarily on the outside. A typical UV-C light source is low pressure mercury vapour electrical discharge bulb. Such a source has a small spectral distribution of energy, with only a strong peak in the short wavelength region of the UV spectrum.

Long wavelength UV radiation, such as UV-A radiation, has better penetration properties. A typical UV-A source is a medium or high pressure mercury vapour electrical discharge bulb. Recently UV-LEDs have become commercially available which also emit in the UV-A spectrum and that have the potential to replace gas discharge bulb UV sources. By doping the mercury gas in the discharge bulb with iron or gallium, an emission can be obtained that covers both the UV-A and UV-C spectrum. The intensity of a curing source has a direct effect on curing speed. A high intensity results in higher curing speeds.

The curing speed should be sufficiently high to avoid oxygen inhibition of free radicals that propagate during curing. Such inhibition not only decreases curing speed, but also negatively affects the conversion ratio of monomer into polymer. To minimize such oxygen inhibition, the imaging apparatus preferably includes one or more oxygen depletion units. The oxygen depletion units place a blanket of nitrogen or other relatively inert gas (e.g. $CO_2$), with adjustable position and adjustable inert gas concentration, in order to reduce the oxygen concentration in the curing environment.

Residual oxygen levels are usually maintained as low as 200 ppm, but are generally in the range of 200 ppm to 1200 ppm.

Another way to prevent oxygen inhibition is the performance of a low intensity pre-exposure before the actual curing.

A partially cured fluid droplet is solidified but still contains residual monomer. This approach improves the adhesion properties between the layers that are subsequently printed on top of each other. Partial intermediate curing is possible with UV-C radiation, UV-A radiation or with broad spectrum UV radiation. As mentioned above, UV-C radiation cures the outer skin of a fluid droplet and therefore a UV-C partially cured fluid droplet will have a reduced availability of monomer in the outer skin and this negatively affects the adhesion between neighbouring layers of the relief image. It is therefore preferred to perform the partial curing with UV-A radiation.

A final post curing however is often realized with UV-C light or with broad spectrum UV light. Final curing with UV-C light has the property that the outside skin of the print master is fully hardened.

EXAMPLES

Materials

All materials used in the examples were readily available from standard sources such as Aldrich Chemical Co. (Belgium) and Acros (Belgium) unless otherwise specified.

SR506D is an isobornylacryate available from Sartomer.
Genomer 1122 is a low viscous monofunctional urethane acrylate (2-acrylic acid 2-(((acryl-amino)carbonyl)oxy) ethylester) from RAHN.
Santicizer 278 is a high molecular weight Texanol Benzyl Phthalate plasticizer from MONSANTO.
Laromer TBCH is a 4-t.butyl cyclohexyl acrylate from BASF.
VEEA is a 2-(2-vinyloxyethoxy)ethyl acrylate >98% from NIPPON SHOKUBAI.
CD561 is an alkoxylated hexane diol diacrylate from SARTOMER.
Ebecryl 1360 is silicone hexa acrylate from Cytec.
SR340 is a 2-phenoxy ethyl methacrylate from SARTOMER.
SR610 is a polyethylene glycol (600) diacrylate from SARTOMER.
Agfarad is a mixture of 4 wt. % p-methoxyphenol, 10 wt. % 2,6-di-tert-butyl-4-methylfenol and 3.6 wt. % Aluminium N-nitroso-phenylhydroxylamine (available from CUPFERRON AL) in DPGDA.

DPGDA is a dipropylene glycol diacrylate available from UCB.
Irgacure 819 is a UV-photoinitiator from CIBA.
SR238 is a 1,6 hexanediol diacrylate from SARTOMER.
TMPTA is trimethylolpropane triacrylate from Cytec.

The curable fluids INV-1 to INV-5 and COMP-1 to COMP-8 were prepared by mixing the ingredients listed in Table 1.

TABLE 1

| Ingredient (wt. %) | INV-1 | INV-2 | INV-3 | INV-4 |
|---|---|---|---|---|
| SR506D | 40.17 | 19.87 | 24.77 | — |
| Laromer TBCH | — | — | — | 44.56 |
| Genomer 1122 | 13.90 | 34.80 | 19.90 | 34.80 |
| CD561 | 40.20 | 19.80 | — | 14.90 |
| SR340 | — | 19.80 | 24.80 | — |
| SR610 | — | — | 24.80 | — |
| Agfarad | 0.70 | 0.70 | 0.70 | 0.70 |
| Ebecryl 1360 | 0.03 | 0.03 | 0.03 | 0.04 |
| Irgacure 819 | 5.00 | 5.00 | 5.00 | 5.00 |

| Ingredient (wt. %) | INV-5 | COMP-1 | COMP-2 | COMP-3 |
|---|---|---|---|---|
| SR506D | — | 60.07 | 60.07 | 52.07 |
| Laromer TBCH | 56.26 | — | — | — |
| Genomer 1122 | 21.10 | — | 34.20 | — |
| SR610 | 16.90 | 34.20 | — | 29.70 |
| Agfarad | 0.70 | 0.70 | 0.70 | 0.70 |
| Ebecryl 1360 | 0.04 | 0.03 | 0.03 | 0.03 |
| Santicizer 278 | — | — | — | 12.50 |
| Irgacure 819 | 5.00 | 5.00 | 5.00 | 5.00 |

| Ingredient | COMP-4 | COMP-5 | COMP-6 | COMP-7 |
|---|---|---|---|---|
| SR506D | 94.26 | 53.66 | 53.66 | 53.66 |
| CD561 | — | — | — | 28.84 |
| VEEA | — | — | — | — |
| Genomer 1122 | — | — | — | — |
| SR610 | — | 28.84 | — | — |
| SR238 | — | — | 28.84 | — |
| Agfarad | 0.70 | — | — | — |
| Ebecryl 1360 | 0.04 | — | — | — |
| Santicizer 278 | — | 12.50 | 12.50 | 12.50 |
| Irgacure 819 | 5.00 | — | 5.00 | 5.00 |

| Ingredient | COMP-8 | COMP-9 | COMP-10 |
|---|---|---|---|
| Laromer TBCH | — | 25.00 | 25.00 |
| CD561 | — | — | — |
| VEEA | 56.26 | — | 51.00 |
| Genomer 1122 | 21.10 | 10.00 | 10.00 |
| SR610 | 16.90 | 8.00 | 8.00 |
| TMPTA | — | 51.00 | — |
| Agfarad | 0.70 | 0.70 | 0.70 |
| Ebecryl 1360 | 0.04 | 0.04 | 0.04 |
| Santicizer 278 | — | — | — |
| Irgacure 819 | 5.00 | 5.00 | 5.00 |

The comparative fluids COMP-01 to COMP-08 only contain two from the three mandatory ingredients according to the present invention. The comparative fluids COMP-9 and 10 do contain the three mandatory ingredients, but the sum of the three ingredients is less than 50 wt % relative to the total fluid.

To evaluate the usefulness as UV curable fluid for making a flexographic printing master by means of inkjet, the viscosity of the fluids and the hardness, elongation at break and creep recovery of the cured fluids were evaluated.

Viscosity

The viscosity of the curable jettable fluids was measured with a Brookfield DV-II+Pro viscometer using the programs 6T (25° C., 6 rpm) and 12T (45° C., 12 rpm).

Hardness Determination

Standard measurements of the hardness of various substances are currently performed using durometer hardness test procedures, such as those set forth in ASTM D2240. The durometer hardness procedures are used for determining indentation hardness of various substances, and are particularly useful for elastomeric materials. These test methods measure the depression force of a specific type of indentor as it is forced under specific conditions against the material's surface. Due to the various parameters which influence hardness determinations, different durometer scales have been established. A particular scale is chosen depending on the type of material to be measured. For example, materials which are relatively soft, such as elastomeric materials, are measured on a Shore A scale. Shore A scale measurements use a steel rod indentor shaped with a blunt end, and a calibrated spring force. The indentor descends at a controlled rate against the specimen surface and a reading is recorded within a specified time period. This procedure is repeated multiple times at different positions on the specimen and the arithmetic mean of the results yields the Shore A measurement.

The samples to be measured were prepared as follows. A petri dish made out of polystyrene and having a diameter of 5.6 cm was filled with 10 g of the curable fluids.

Assuming that the specific weight of the liquid photopolymer is approx. 1.015 g/ml, the height of the added photopolymer was ±4 mm (volumetric shrinkage not taken in account). The filled petri dish was placed in a quartz glass box filled up with Nitrogen.

The samples were exposed with UV-A light in a light box equipped with 8 Philips TL 20W/10 UVA ($\lambda_{max}$=370 nm).

The distance between the lamp and the sample was approx. 10 cm. The Curing time was 10 minutes. Subsequently the samples were back exposed during 10 min. After releasing the disk-shaped UV-A cured fluids out of the Petri dish, a UV-C post-curing (also making use of the quartz box filled with nitrogen) was carried out.

This treatment was carried out in a light-box equipped with 4 Philips TUV lamps ($\lambda_{max}$=254 nm). The upper side was cured during 20 minutes.

Elongation at Break

Elongation at break, expressed as a percentage compared to the initial length at rest, corresponds to the maximum elongation prior to breaking.

Elongation at break, expressed as a percentage compared to the initial length at rest, corresponds to the maximum elongation attained prior to breaking.

Strips made of 2 adhered layers of a Tesa plate mounting tape 52338 (thickness 0.5 mm incl. protective layer) with a width of 1.5 cm were mounted on the border of a Lumirror X43 support from Toray in the linear direction. These guidance border strips were used in combination with a 100 μm coating knife and acted as a spacing aid to obtain a final coated/cured layer thickness of approx. 0.38 mm.

The coated layer was then placed very cautious (must be kept perfectly horizontal to avoid spreading out) in a quartz glass box filled with nitrogen gas before curing.

UV-A curing was carried out with a UV-A Light box equipped with 8 Philips TL 20W/10 UVA (max=370 nm) lamps. The distance between the lamp and the sample was approx. 10 cm. Curing time was 3 minutes.

After this step, a UV-C post-treatment step was carried out. UV-C post-curing was carried out with a light-box equipped with 4 Philips TUV lamps (max=254 nm). Post-curing was also performed under $N_2$ and the curing time was 20 minutes.

Then, a T-bone shaped sample (150 mm×19 mm) was cut out and the polymerized layer was stripped of from its temporary support. Elongation at break measurements were carried out on Instron 4469 Universal Testing Machine (stretching with an elongation speed of 10 mm/min @ 22° C.)

Creep Recovery after Static Compression

Creep recovery reflects the resistance of a material to deform permanently to relieve stresses. To determine creep properties, a sample is subjected to prolonged constant tension or compression at constant temperature. Deformation is recorded at specified time intervals and a creep vs. time diagram is plotted. The slope of the curve at any point is the creep rate. If the specimen does not fracture within the test period, the creep recovery can be measured.

A circular cured sample of the curable jettable liquid (prepared as described for the T-bone sample in the elongation at break test method), having a diameter of 6.2 mm and a thickness of 0.38 mm, was deformed in a Texas Instruments DMA 2980 (dynamic mechanical analysis) apparatus with a ball point probe having a diameter of 2.7 mm during 5 minutes with a set pressure of 0.005 MPa.

After release of the pressure, creep recovery is determined after 1.2 s, the shortest measurable recovery time.

The results of these measurements are given in Table 2.

Good results are obtained when:
The hardness (Shore A) is less than 80
The elongation at break is at least 30%
The creep recovery is higher than 70% after 1.2 seconds.

TABLE 2

|  | visco (mPa·s) | hardness (Shore A) | elongation at break | creep recovery | external plasticizer |
|---|---|---|---|---|---|
| INV-1 | 9.4 | 73 | 34% | 90% | No |
| INV-2 | 8.7 | 60 | 37% | 86% | No |
| INV-3 | 9.9 | 62 | 32% | 92% | No |
| INV-4 | 8.3 | 58 | 37% | 77% | No |
| INV-5 | 8.6 | 52 | 46% | 78% | No |
| COMP-1 | 9.7 | 72 | 37% | 23% | No |
| COMP-2 | 4.9 | 80 | >65% | 2.3% | No |
| COMP-3 | 12.4 | 66 | 38% | 67% | Yes |
| COMP-4 | 3.2 | 77 | >55% | 12.3% | No |
| COMP-5 | 12.16 | 65 | 73% | 71% | Yes |
| COMP-6 | 5.64 | 83 | Not measured | Not measured | Yes |
| COMP-7 | 9.73 | 75 | 63% | 47% | Yes |
| COMP-8 | 4.10 | 84 | 10% | 84% | No |
| COMP-9 | 16.90 | 99 | 7% | 57.5% | No |
| COMP-10 | 4.10 | 90 | 17% | 32.90% | No |

From the results in table 2 it is clear that a low viscosity curable jettable fluid (viscosity less than 15 mPa·s), i.e. having no plasticizer, and having good "flexographic" properties can only be obtained when the fluid contains at least 50 wt. % of a mixture of a cyclic monofunctional acrylate monomer, a monofunctional urethane acrylate oligomer and a difunctional (meth)acrylate monomer.

The invention claimed is:

1. A curable jettable fluid, which when applied as a layer and subsequently cured, produces a printing master layer of thickness 0.38 mm and an elongation at break of at least 30%, the curable jettable fluid contains no plasticizer and which has a viscosity measured at 45° C. at 12 rpm utilizing a 12T program of a Brookfield DV-II+Pro viscosimeter of less than 15 mPa·s and which comprises at least 50 wt. % relative to the total weight of the fluid of a mixture of a cyclic monofunctional (meth)acrylate monomer, monofunctional urethane acrylate, and a difunctional (meth)acrylate monomer.

2. The curable jettable fluid according to claim 1, wherein the jettable fluid comprises at least 75 wt. % relative to the total weight of the fluid of a mixture of a cyclic monofunctional (meth)acrylate monomer, monofunctional urethane acrylate, and a difunctional (meth)acrylate monomer.

3. The curable jettable fluid according to claim 1, wherein the jettable fluid has a viscosity measured at 45° C. at 12 rpm utilizing the 12T program of a Brookfield DV-II+Pro viscosimeter of less than 10 mPa·s.

4. The curable jettable fluid according to claim 2, wherein the jettable fluid has a viscosity measured at 45° C. at 12 rpm utilizing the 12T program of a Brookfield DV-II+Pro viscosimeter of less than 10 mPa·s.

5. The curable jettable fluid according to claim 1, wherein the difunctional (meth)acrylate monomer is a polyalkylene glycol di(meth)acrylate.

6. The curable jettable fluid according to claim 2, wherein the difunctional (meth)acrylate monomer is a polyalkylene glycol di(meth)acrylate.

7. The curable jettable fluid according to claim 6, wherein the difunctional (meth)acrylate monomer is a polyethylene glycol di(meth)acrylate.

8. The curable jettable fluid according to claim 1, wherein the difunctional (meth)acrylate monomer is an alkoxylated hexanediol di(meth)acrylate.

9. The curable jettable fluid according to claim 1, wherein the monofunctional urethane acrylate, is an aliphatic urethane acrylate.

10. The curable jettable fluid according to claim 2, wherein the monofunctional urethane acrylate, is an aliphatic urethane acrylate.

11. The curable jettable fluid according to claim 1, wherein the cyclic monofunctional (meth)acrylate monomer is isobornyl acrylate or 4-t.butyl cyclohexyl acrylate.

12. The curable jettable fluid according to claim 2, wherein the cyclic monofunctional (meth)acrylate monomer is isobornyl acrylate or 4-t.butyl cyclohexyl acrylate.

13. The curable jettable fluid according to claim 5, wherein the cyclic monofunctional (meth)acrylate monomer is isobornyl acrylate or 4-t.butyl cyclohexyl acrylate.

14. The curable jettable fluid according to claim 6, wherein the cyclic monofunctional (meth)acrylate monomer is isobornyl acrylate or 4-t.butyl cyclohexyl acrylate.

15. The curable jettable fluid according to claim 1, wherein the jettable fluid further comprises an initiator.

16. The curable jettable fluid according to claim 15, wherein the initiator is a photo-initiator.

17. A method of preparing a flexographic printing master comprising the steps of:
    providing a flexographic support;
    jetting subsequent layers of a curable fluid as defined in claim 1 on the flexographic support; and
    at least partially curing each jetted layer before a following layer is applied.

18. A method of preparing a flexographic printing master comprising the steps of:
    providing a flexographic support;
    jetting subsequent layers of a curable fluid as defined in claim 6 on the flexographic support; and
    at least partially curing each jetted layer before a following layer is applied.

19. A method of preparing a flexographic printing master comprising the steps of:
    providing a flexographic support;
    jetting subsequent layers of a curable fluid as defined in claim 14 on the flexographic support; and
    at least partially curing each jetted layer before a following layer is applied.

20. The method according to claim 17, wherein the support is a basic sleeve.

21. The method according to claim 19, wherein the support is a basic sleeve.

22. The curable jettable fluid according to claim 1, wherein the monofunctional urethane acrylate is a polyether urethane acrylate.

23. The curable jettable fluid according to claim 9, wherein the aliphatic urethane acrylate has a viscosity of 100 mPa·s or lower at 25° C.

24. The curable jettable fluid according to claim 9, wherein the aliphatic urethane acrylate is 2-acrylic acid 2-{[(butylamino)carbonyl]oxy}ethyl ester.

25. The curable jettable fluid according to claim 1, wherein the monofunctional urethane acrylate is a monofunctional urethane acrylate oligomer.

* * * * *